US011449114B2

(12) United States Patent
Minnehan et al.

(10) Patent No.: US 11,449,114 B2
(45) Date of Patent: Sep. 20, 2022

(54) VOICE ACTIVATED DEVICE WITH INTEGRATED HEATSINK AND SPEAKER

(71) Applicant: Amazon Technologies, Inc., Seattle, WA (US)

(72) Inventors: Allen David Minnehan, Mountain View, CA (US); Miguel A. Morales, Santa Clara, CA (US); Nathan M. Li, Sunnyvale, CA (US); Albert John Yu Sam Chua, San Jose, CA (US); Matthew F. Ardema, San Bruno, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 274 days.

(21) Appl. No.: 16/829,548

(22) Filed: Mar. 25, 2020

(65) Prior Publication Data
US 2021/0303041 A1    Sep. 30, 2021

(51) Int. Cl.
*G06F 1/20* (2006.01)
*F21V 33/00* (2006.01)
*G06F 3/16* (2006.01)
*H04R 1/02* (2006.01)
(Continued)

(52) U.S. Cl.
CPC ............ *G06F 1/20* (2013.01); *F21V 33/0056* (2013.01); *G06F 3/167* (2013.01); *H04R 1/025* (2013.01);
(Continued)

(58) Field of Classification Search
CPC . G06F 1/20; G06F 3/167; G06F 1/181; G06F 3/0416; F21V 33/0056; F21V 7/04; F21V 19/0015; F21V 13/02; F21V 33/0052; F21V 15/012; F21V 23/0435; F21V 23/0485; H04R 1/025; H04R 9/06; H04R 2201/028; H04R 2420/07; H04R 1/028; H04R 1/02; H04R 9/022; H04R 2201/025; H04R 5/02; H04R 1/345; H04R 2201/029; H04R 2430/20; H04R 3/005; H04R 1/04;
(Continued)

(56) References Cited

U.S. PATENT DOCUMENTS

| 4,368,406 A * | 1/1983 | Kruzich ............... H05B 39/042 |
| | | 315/156 |
| 8,175,304 B1 * | 5/2012 | North ...................... H04R 5/02 |
| | | 381/89 |

(Continued)

OTHER PUBLICATIONS

PCT, "International Search Report and Written Opinion" App. No. PCT/US2021/024108, dated Aug. 4, 2021; 21 pages.

*Primary Examiner* — Angelica M McKinney
(74) *Attorney, Agent, or Firm* — Eversheds Sutherland (US) LLP

(57) ABSTRACT

Systems, methods, and computer-readable media are disclosed for voice activated devices with integrated heatsinks and speakers. In one embodiment, an example voice activated device may include a housing having an upper portion and a lower portion, a speaker housing coupled to the lower portion, where the speaker housing and the lower portion together form a sealed chamber, a heatsink coupled to the lower portion and disposed in the sealed chamber, and a first speaker coupled to the speaker housing and partially disposed within the sealed chamber, where the first speaker is oriented to output audio towards the upper portion of the housing.

20 Claims, 10 Drawing Sheets

(51) Int. Cl.
  *H04R 9/06* (2006.01)
  *F21Y 115/10* (2016.01)
  *H05K 1/18* (2006.01)
(52) U.S. Cl.
  CPC ............ *H04R 9/06* (2013.01); *F21Y 2115/10* (2016.08); *H05K 1/189* (2013.01)
(58) Field of Classification Search
  CPC .......... H04R 1/34; H04R 1/023; H04R 1/403; H04R 3/12; F21Y 2115/10; F21Y 2105/18; H05K 1/189; H05K 7/2039; G10L 15/22; G10L 2015/223; G10L 15/08; G10L 2015/088; G04G 21/06; G04G 17/08; H04W 84/12; H04B 1/3888; H04Q 1/08; F21L 4/02; F21L 4/08
  See application file for complete search history.

(56) References Cited

U.S. PATENT DOCUMENTS

| | | | | |
|---|---|---|---|---|
| 10,448,520 | B2* | 10/2019 | Tak | H04R 1/24 |
| 2016/0345086 | A1* | 11/2016 | Chamberlin | H04R 1/028 |
| 2017/0295275 | A1* | 10/2017 | Houtchens | H04M 1/62 |
| 2018/0091878 | A1 | 3/2018 | Della Rosa et al. | |
| 2018/0190285 | A1* | 7/2018 | Heckmann | G06F 1/20 |
| 2019/0069078 | A1* | 2/2019 | Johnson | H04R 1/025 |
| 2019/0215926 | A1* | 7/2019 | Lay | F21V 23/0492 |
| 2019/0394547 | A1 | 12/2019 | Lemons et al. | |
| 2020/0088360 | A1* | 3/2020 | Salzinger | F21V 15/012 |
| 2021/0027776 | A1* | 1/2021 | Wodrich | H04R 1/02 |
| 2021/0099779 | A1* | 4/2021 | Tang | H04R 9/022 |
| 2021/0100065 | A1* | 4/2021 | Lee | H05K 1/0203 |

\* cited by examiner

VOICE ACTIVATED DEVICE WITH INTEGRATED HEATSINK AND SPEAKER

BACKGROUND

Electronic devices may have heatsinks, speakers, and other components. Certain devices may include additional components, such as microphones, lighting, and so forth. However, certain devices may have limited footprints or compact sizes. Such form factors may result in poor sound quality due to speaker size and other factors. As a result, devices with reduced footprints and/or smaller form factors and improved sound quality may be desired.

Figure 1:
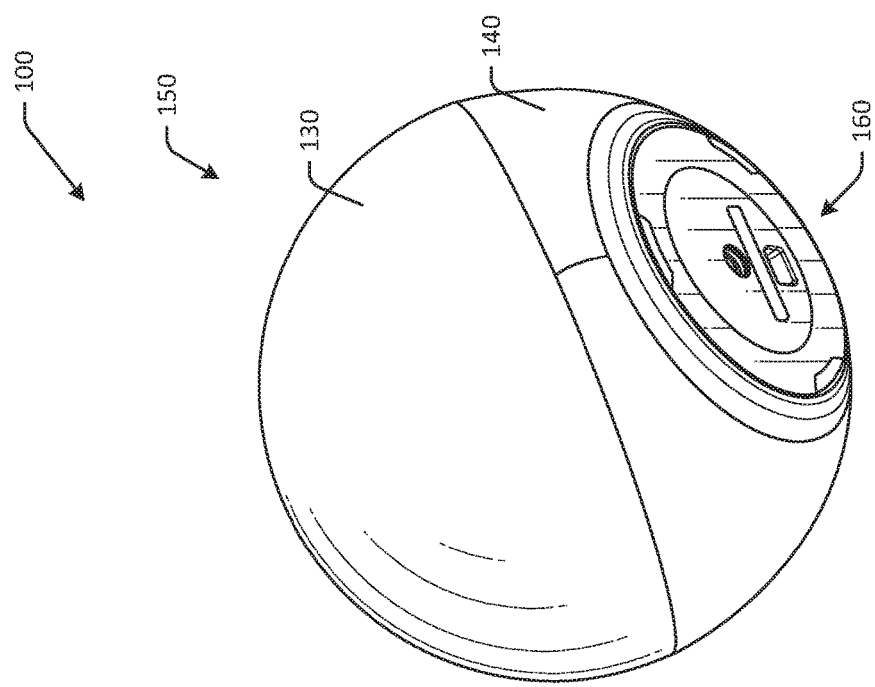
FIG. 1 is a schematic drawing of a voice activated device with integrated heatsink and speaker in various views in accordance with one or more embodiments of the disclosure.
Figure 1:
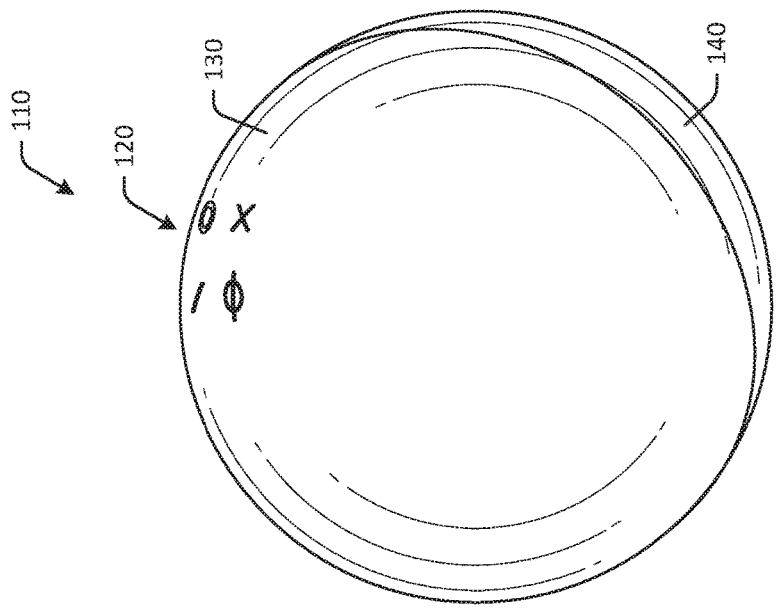

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may encompass, depending on the context, a plural number of such components or elements and vice versa.

DETAILED DESCRIPTION

Overview

Voice activated devices may be devices that users can interact with via voice-based input, such as speech input, as well as other optional input types, such as touch input, buttons, and other inputs. Some voice activated devices may be voice assistant devices. For example, a voice assistant device may be a device that a user can interact with via speech input to perform certain tasks. In an example, a user may audibly speak "Alexa, play my workout playlist." A voice assistant device or other voice activated device may detect the speech input, and may determine a meaning of the speech input. For example, the voice assistant device may detect the speech input using one or more microphones, and may determine a meaning of the speech input in conjunction with one or more voice processing servers. The voice assistant device may provide a response, such as an audible or visual response, using a display and/or speaker coupled to, or otherwise in communication with, the voice assistant device. Certain voice activated devices may be controlled by voice-based commands or may otherwise respond to verbal or audible utterances. In another example, voice activated devices may detect sounds in an ambient environment and may determine that a voice activated is being invoked based on, for example, detection of a wakeword or other trigger. A user may say or utter the wakeword to invoke the voice activated. The voice activated device may detect the wakeword and listen for a request or voice command, and may respond accordingly. For example, the voice activated device may cause one or more operations to be performed, such as controlling other devices (e.g., televisions, lights, radios, thermostats, etc.), may respond with audio or visual information (e.g., weather, news, messages, etc.), and/or may perform different actions in response to a request or command.

Some voice activated devices may have compact form factors or small footprints. For example, a voice activated device that is to be placed on a table may have a limited footprint so as to avoid occupying too much space on the table. As a result, internal space in the device for device components may be limited. For example, an amount of room for speakers, light emitting diodes (LEDs), and other components may be limited. Speaker quality and/or performance (e.g., a range of sound frequency that can be output by a speaker, etc.) may be impacted by an amount of air that can be displaced by a speaker. For example, speakers for which relatively less air can be displaced may have reduced performance relative to speakers for which relatively more air can be displaced. For devices with limited form factors or internal volumes, sound quality and/or speaker performance may be reduced. However, embodiments of the disclosure may include voice activated devices with integrated heatsink and speaker assemblies that provide increased air for displacement, thereby providing improved sound quality and/or speaker performance, while maintaining compact footprints and/or small form factors.

Embodiments of the disclosure may include voice activated devices that are configured to operate in various environments, such as environments with limited space, while maintaining audible and/or visual interaction capabilities with users and providing high quality audio and/or speaker performance. For example, embodiments of the disclosure may be configured to provide 360 degree sound (e.g., 360 degree sound about the device, etc.), as well as a "sound stage" experience with stereo sound. As a result, users may be able to distinguish between left and right channel sounds at certain positions about the device. In addition, some embodiments may include ambient light sensors disposed adjacent to one or more clear buttons, such that ambient light sensor measurements can be determined and used to adjust light intensity of one of more LEDs in the device. Due to the positioning of the ambient light sensor(s), the device may retain a sleek aesthetic look without needing paint masks or other openings in an external surface to capture ambient light measurements. Some embodiments may include a light ring disposed at a lower portion, such as at or near a bottom, of the device, where the light ring may provide visual feedback to a user. For example, the light ring may indicate a direction from which speech input is detected to a user. To avoid bright spots or other non-uniform display of lighting, embodiments may include a reflector to evenly distribute light from one or more LEDs. In addition, some embodiments may include one or more subwoofers that may be used in conjunction with one or more tweeters to output sound of an increased frequency range and/or to improve sound quality.

The techniques, methods, and processes described herein may be used to detect and/or determine voice-based requests or commands, and to initiate actions that may include controlling other electronic devices. For example, certain embodiments may be configured to output signals that control aspects of home entertainment systems, HVAC systems, appliances, and so forth, and may be configured to output audio signals via one or more speakers.

This disclosure relates to, among other things, systems, methods, computer-readable media, techniques, and methodologies for voice activated devices with integrated heatsinks and speakers. Embodiments may include devices that can be voice-controlled and respond to audible instructions, output audio content, control other electronic devices and/or other operations. Some embodiments include a light ring or other visual indicator that can be used to convey certain information to a user, such as a detected location or direction of sound or a sound source, or a detected location of the user that is currently being listened to by the device, as well as device states, such as a listening state, a processing state, a muted or privacy state, and/or other states. As a result, embodiments of the disclosure may be configured to provide audio and/or visual indicators to users in various environments. Certain embodiments may include light ring features or other components that can be used to convey information to users.

Referring to FIG. 1, an example voice activated device 100 is depicted in accordance with one or more embodiments of the disclosure. FIG. 1 depicts the voice activated device 100 in a top perspective view 110 and a bottom perspective view 150. The voice activated device 100 may include a housing having an upper portion 130 and a lower portion 140. The voice activated device 100 may have a substantially spherical shape or geometry (e.g., a spherical exterior with a flat bottom surface, etc.), in an example embodiment. The voice activated device 100 may include a number of buttons 120. The buttons may include volume adjustment button(s), action button(s), mute or privacy button(s), and/or other types of buttons. The buttons 120 may be disposed on the upper portion 130 of the housing. In the illustrated embodiment, the buttons 120 may include a volume increase button, a volume decrease button, an action button (e.g., a button used to turn off or snooze an alarm, set up WiFi, etc.), and a privacy button that may disable any microphones or cameras at the voice activated device 100. One or more of the buttons 120 may be clear and/or translucent. The upper portion 130 and the lower portion 140 may be coupled along a non-horizontal or non-vertical joint, relative to the flat bottom. For example, as illustrated in FIG. 1, the upper portion 130 and the lower portion 140 of the housing may be coupled along an angled or transverse joint relative to the flat bottom of the voice activated device 100.

The voice activated device 100 may include one or more lighting components, such as a light ring 160 disposed about the lower portion 140 of the housing. In some embodiments, the light ring 160 may be a circular light ring component that is disposed at or near a lower or bottom surface of the voice activated device 100 ("top," "bottom," and "side" are used to describe relative and not absolute positioning). The light ring 160 may be disposed about an outer surface of the voice activated device 100, such as about the lower portion 140 of the housing. In other embodiments, the light ring may not be circular in that the light ring may not extend fully around the voice activated device. Accordingly, in some embodiments, the light ring may be semicircular, linear, oval, or another geometry.

The voice activated device 100 may include one or more microphones configured to detect sound and/or generate an audio signal. The microphones may be positioned within the housing (e.g., adjacent to or near a top of the voice activated device 100 in an example embodiment, etc.) and may correspond to the locations of one or more microphone holes on the upper portion 130 of the housing. In some embodiments, the voice activated device 100 may include a flexible substrate with one or more, or a plurality of, microphones. The flexible substrate may include individual microphones arranged or oriented so as to detect sounds from a certain side, such as a "left" side or a right "side" of the voice activated device 100. As discussed herein, the voice activated device 100 may also include a speaker to output audio.

The buttons 120 of the voice activated device 100 may include one or more pressable or physical buttons. For example, the voice activated device 100 may include smooth buttons or buttons with raised protrusions or raised nub that can be used to locate a particular button by a user without visualizing the particular button. Any number of buttons or manually configurable inputs may be included. The button(s) may be arranged in any order, such as a circular arrangement, a rectangular arrangement, a linear arrangement, or another arrangement.

The voice activated device 100 may include one or more connection ports that can be used to create one or more wired or wireless connections. The connection ports may be disposed along the lower portion 140 of the housing. For example, the voice activated device 100 may include an auxiliary connection port, an input and/or output port, a charging or power jack port, and/or other ports. The connection ports may be disposed along a back surface of the lower portion 140.

The voice activated device 100 may include the light ring 160. The light ring 160 may be a lighting component, such as a circular light ring, that can be used to provide one or more visual indicators. The light ring 160 may be positioned on or near a bottom side of the voice activated device 100 (e.g., bottom relative to the top and sides in this example). The light ring 160 may output light that is visible by users. As described herein, the light ring 160 may allow light emitted from one or more, or a plurality of, top-firing or side-firing LEDs to be visible by users that are external to the voice activated device 100. For example, in FIG. 1, a user may be speaking an utterance from the right side of the voice activated device 100. The voice activated device 100 may detect the utterance and may generate a visual indicator using the one or more LEDs, and may indicate the direction from which the utterance is being detected. The user may therefore be aware that the voice activated device is in a listening state.

Because the LEDs may be spread apart from each other, light may typically appear non-uniform when viewed by a user. For example, light may appear brighter in areas where LEDs are located inside the voice activated device 100. To increase light uniformity, embodiments of the disclosure may include a reflector component that may direct or guide light emitted by the one or more LEDs, so as to reduce non-uniformity. For example, the light ring 160 may be positioned adjacent to a reflector component disposed within the housing. The reflector component may include various features to guide light to locations that may appear dim relative to other locations.

The light ring 160 may form part of an outer surface of the voice activated device 100. In some embodiments, the light ring 160 may form part of the housing of the voice activated device 100. The light ring 160 may be an optically clear or translucent resin of a light or dark color. Light transmission or translucency of the material may be between about 45% and about 60%, such as about 50%. Translucency of the light bar may be based on a thickness of the light ring.

The voice activated device 100 may have a spherical housing. The spherical housing may include a top portion, such as the upper portion 130, and a bottom portion, such as the lower portion 140. The voice activated device 100 may include an integrated speaker and heatsink assembly, as discussed with respect to FIGS. 2 and 4-5. The integrated speaker and heatsink assembly may include a speaker housing coupled to a first side of the lower portion 140. The speaker housing and the lower portion 140 may together enclose a sealed chamber. A heatsink may be coupled to the lower portion 140 and may be disposed within the sealed chamber. The heatsink may be curved or may otherwise have a non-planar contour. The voice activated device 100 may include a subwoofer coupled to the speaker housing and configured to output sound at a first angle upwards towards the upper portion 130. The subwoofer may be at least partially disposed within the sealed chamber. The voice activated device 100 may include a tweeter coupled to the speaker housing and configured to output sound at a second angle transverse to the first angle, such as directly outwards or towards a lateral side surface of the voice activated device 100. The voice activated device 100 may include a set of LEDs configured to emit light, where the set of LEDs may positioned within the spherical housing. The voice activated device 100 may include a bottom cover coupled to a second side of the lower portion 140, where the bottom cover may have a circular light ring, such as the light ring 160 disposed about a perimeter of the bottom cover, such that light emitted from the set of LEDs is visible through the circular light ring.

Users may verbally interact with the voice activated device 100 to control the voice activated device 100, as well as to optionally control other electronic devices in the ambient environment. The voice activated device 100 may detect the audible sound from a user and may determine a meaning of the sound. For example, the voice activated device 100 may detect a trigger word or a wakeword of "Alexa," or another trigger word, and may subsequently begin monitoring for voice commands using one or more microphones. In some embodiments, detection and/or processing of voice data or voice commands may be done locally at the voice activated device 100, while in other embodiments the voice activated device 100 may communicate with one or more servers to determine a meaning of a voice command. In some embodiments, the trigger word may be detected and determined locally, while voice commands may be processed remotely. After determining or receiving the meaning of the user utterance, the voice activated device 100 may initiate one or more response actions.

Certain embodiments may include integrated heatsinks and speakers or speaker assemblies, such as metal heatsinks and plastic speaker assemblies, thereby increased a compactness of the voice activated device and reducing a footprint and/or form factor of the voice activated device. As a result, embodiments of the disclosure may be used in environments with limited space, yet may provide visual and audible indications to users that can be heard or seen from various positions.

Example embodiments of the disclosure provide a number of technical features or technical effects. For example, in accordance with example embodiments of the disclosure, certain embodiments of the disclosure may increase a visibility of light visible in lighting elements, control multiple electronic devices and/or vehicle control systems, detect voice commands, determine meanings of voice commands, and/or initiate actions in response to voice commands. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
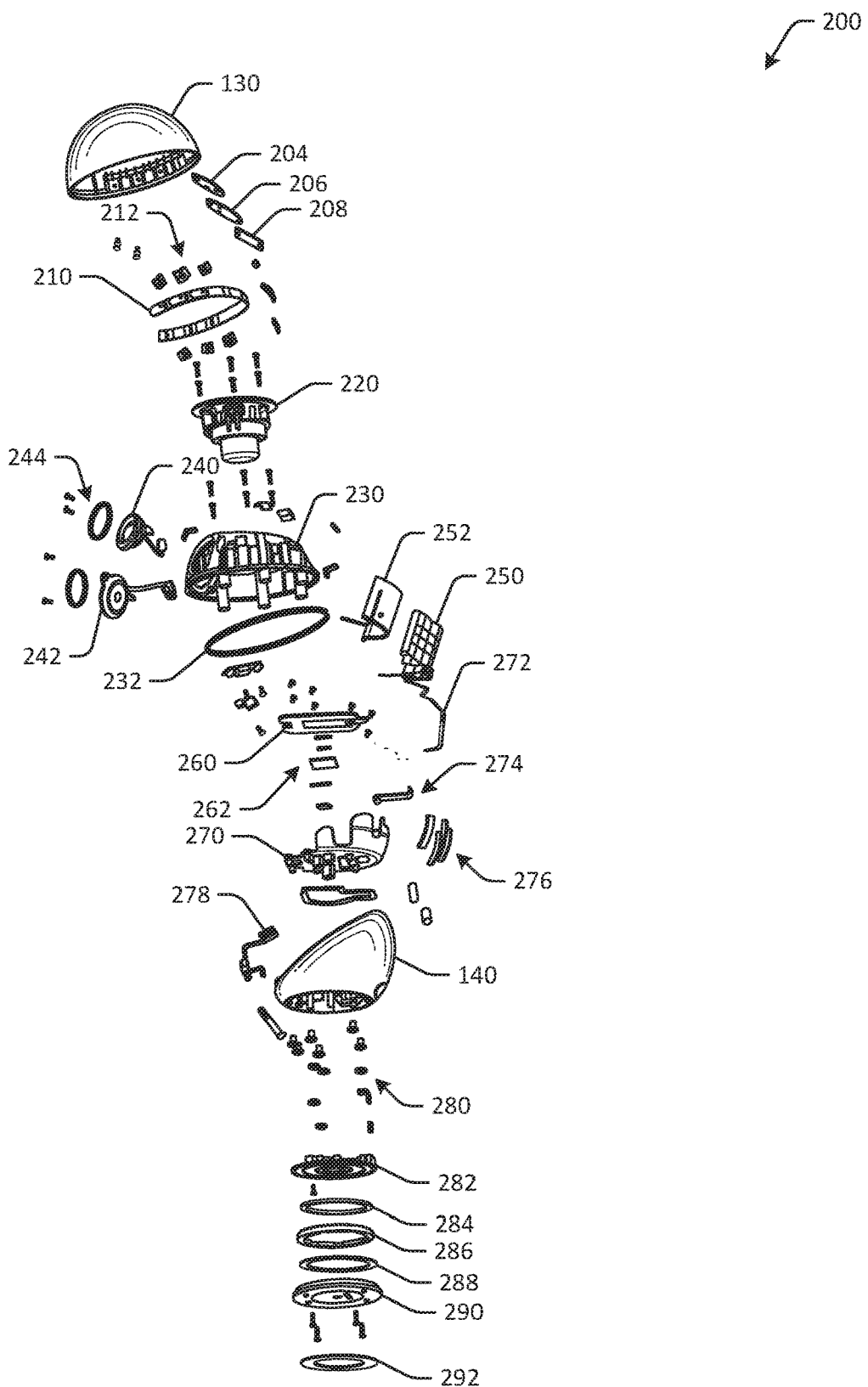
FIG. 2 is a schematic drawing of the voice activated device of FIG. 1 in an exploded view in accordance with one or more embodiments of the disclosure.

FIG. 2 schematically depicts the voice activated device 100 in an exploded view 200 in accordance with one or more embodiments of the disclosure. The voice activated device 100 may be the same or different than the voice activated device 100 of FIG. 1. Other embodiments may include additional or fewer, and/or different, components.

The voice activated device 100 may include a housing having the upper portion 130 and the lower portion 140. The lower portion 140 may have a curved side surface, as depicted in FIG. 2. The voice activated device 100 may include a heatsink 270 that has a curved contour corresponding to the curved side surface of the lower portion 140, as discussed with respect to FIG. 5. In some embodiments, the voice activated device 100 may include a fabric cover that may be disposed about the upper portion 130 of the housing. The fabric cover may provide aesthetic appeal or additional functionality, such as a tactile grip for the voice activated device 100. The lower portion 140 and/or the upper portion 130 may have a hemispherical geometry, and the voice activated device 100 may have a substantially spherical geometry.

In the exploded view 200 of FIG. 2, the voice activated device 100 may include a set of rubber buttons 204, a button printed circuit board 206, and a foam layer 208. Together, the rubber buttons 204, button printed circuit board 206, and the foam layer 208 may form a button assembly. The button assembly may be coupled to the upper portion 130 of the housing. The buttons 204 may be accessible via one or more openings in the upper portion 130. The button printed circuit board 206 may include one or more red or other color LEDs that may be used to illuminate a mute button or privacy button in the set of rubber buttons 204. Some or all of the buttons 204 may be translucent. One or more ambient light sensors may be coupled to the button printed circuit board 206. The ambient light sensor may be disposed adjacent to the translucent button 204, such that the ambient light sensor may obtain accurate light measurements as a result of ambient light that propagates through the translucent button.

The voice activated device 100 may include a number of microphones 212 that may be disposed on a flexible circuit 210. One or more microphones 212 may be included. In the illustrated embodiment, six microphones 212 may be disposed on the flexible circuit 210. The flexible circuit 210 may be coupled to an inner surface of the upper portion 130, such that the microphones 212 are aligned with respective microphone holes in the upper portion 130. The flexible circuit 210 and the button assembly may be coupled to the upper portion to form an upper grill of the voice activated device 100. In other embodiments, a different number of microphones may be included, and may be arranged in a different manner, such as evenly spaced (instead of a first set disposed on a first side of the device and a second set disposed on a second side of the device, etc.).

The voice activated device 100 may include a speaker housing 230 to which one or more speakers may be coupled. The speaker housing 230 may be coupled to the lower portion 140 to form a sealed chamber or otherwise airtight environment. For example, the speaker housing 230 may be coupled to the lower portion 140, and the speaker housing 230 and the lower portion 140 together may form a sealed air chamber.

A first speaker 220 may be coupled to the speaker housing 230. The first speaker may be oriented towards the upper portion 130 of the housing. The first speaker 220 may be a subwoofer or other speaker designed to reproduce low-pitched audio frequencies to provide bass response. The first speaker 220 may be directed at a non-vertical axis relative to a bottom surface of the voice activated device 100. The first speaker 220 may therefore be a subwoofer coupled to an upper surface of the speaker housing 230.

A second speaker 240 may be coupled to a side surface of the speaker housing 230. A third speaker 242 may be coupled to the side surface of the speaker housing 230. The second speaker 240 and/or the third speaker 242 may be tweeters or other speaker drivers that that produce midrange to high range audio frequency. The second speaker 240 may be angled or oriented at a first orientation, and the third speaker 242 may be oriented at a second orientation. An angular distance between the first orientation and the second orientation may be between about 40 degrees and about 100 degrees, such as about 50 degrees, about 75 degrees, and so forth. The angular distance may be a measure between a first central axis of the second speaker 240 determined along its cone and magnet and a second central axis of the third speaker 242 determined along its cone and magnet. The angular distance may be the angle between the first central axis and the second central axis. Specifically, the second speaker may be oriented along a first axis (e.g., first axis 434 in FIG. 4), and the third speaker may be oriented along a second axis (e.g., second axis 444 in FIG. 4). An angular distance between the first axis and the second axis is between about 40 degrees and about 100 degrees. The subwoofer or the first speaker may be oriented along a third axis (e.g., third axis 412 in FIG. 4). The first speaker, which may be the subwoofer may be oriented at an upwards angle of about 65 degrees relative to horizontal, and the second speaker and/or the third speaker may be oriented at an angle of about 0 degrees relative to horizontal (e.g., forward facing, etc.). In other embodiments, the first speaker may be oriented upwards at about 75 degrees, and the second speaker and/or the third speaker may be angled slightly downwards (e.g., minus five degrees, positive five degrees, etc.) relative to a horizontal axis. A distance between the first axis (and/or the second axis) and the third axis may be between about 50 degrees to about 75 degrees in one example.

Foam layers 244 may be disposed about the respective second speaker 240 and the third speaker 242. The second speaker 240 and the third speaker 242 may be disposed adjacent to the upper portion 130, so as to limit an air gap between the second speaker 240 and the third speaker 242 and the upper portion 130, thereby resulting in improved sound. The second speaker 240 and the third speaker 242 may be used to provide stereo sound output. For example, one of the second speaker 240 and the third speaker 242 may present right side channel audio and the other of the second speaker 240 and the third speaker 242 may present left side channel audio. A user standing between the second speaker 240 and the third speaker 242 may be able to determine which speaker certain audio frequencies are being presented from.

The speaker housing 230 may be coupled to the lower portion 140 to form the sealed chamber or volume of air that can be used to facilitate sound output from the speaker(s). A foam layer 232 may be disposed between the speaker housing 230 and the lower portion 140. A number of components may be disposed within the sealed chamber formed by the speaker housing 230 and the lower portion 140. For example, the voice activated device 100 may include a heatsink 270 coupled to the lower portion 140 and disposed in the sealed chamber. The speaker housing 230 and the lower portion 140 may therefore form an integrated heatsink and speaker assembly.

The heatsink 270 may be a metal heatsink, such as an aluminum heatsink may form a sealed cavity. As discussed with respect to FIG. 5, the heatsink 270 may have a number of raised sidewall elements with a curved or non-planar contour that corresponds to the curvature of the lower portion 140. Unlike other heatsink applications, the use of fins may not be effective as the heatsink 270 may be disposed at least partially within the sealed chamber. Foam supports 276 may be disposed between the heatsink 270 and the sidewall of the lower portion 140.

A main login board 260 may be coupled to the heatsink 270 using one or more screws. The main logic board 260 may be coupled to the microphone flexible circuit 210 and/or the button printed circuit board 206 using a flexible printed circuit assembly 272. One or more thermal pads 262 and/or shields, such as WiFi shields may be disposed on the main login board 260 and may be positioned between the main login board 260 and the heatsink 270.

An antenna bracket 250 may be disposed adjacent to the speaker housing 230. The antenna bracket 250 may have a non-planar contour, and may be curved corresponding to curvature of the upper portion 130 and/or the lower portion 140. A flexible antenna assembly 252 may be coupled to the antenna bracket 250. The flexible antenna assembly 252 may include one or more antennas, such as a long range (LoRa) antenna or another type of Wide Area Network (WAN) antenna, a Bluetooth antenna, a ZigBee antenna, and so forth. The flexible antenna assembly 252 may be coupled to the main logic board 260 via the flexible printed circuit assembly 272.

An amplifier board 282 may be coupled to the lower portion 140. In some embodiments, the amplifier board 282 may be coupled to a bottom cover 290 of the voice activated device 100. The amplifier board 282 may be used to power the speakers of the voice activated device 100. The amplifier board 282 may be coupled to the main logic board 260 via a jumper flex 274. The amplifier board 282 may therefore be in electrical communication with the main logic board 260. The amplifier board 282 may be in electrical communication with the first speaker 220, the second speaker 240, and the third speaker 242 via a speaker cable assembly 278 that may pass through a lower surface of the lower portion 140.

A number of components may be disposed between the amplifier board 282 and the bottom cover 290, such as a foam layer 284, a reflector component 286, and a reflector foam layer 288. The foam layer 284, reflector component 286, and reflector foam layer 288 are discussed in more detail with respect to FIG. 8. A rubber foot or other rubber component 292 may be coupled to the bottom cover 290 to provide a secure grip between the voice activated device 100 and a surface on which it is placed. The rubber foot may be formed of nitrile rubber and may have a hardness durometer of between about 30 Shore A and about 80 Shore A, such as about 60 Shore A.

One or more screws 280 may be used to secure various components of the voice activated device 100. For example, to lock the upper portion 130 to the lower portion 140, a screw 280 may be used to pass through the lower surface of the lower portion, and be threaded through a first tab in the lower portion 140 and a second tab in the upper portion 130. For example, the upper portion 130 and the lower portion 140 may include tabs that can be aligned by rotating the upper portion 130 relative to the lower portion 140. When aligned, one or more screws 280 may be used to secure the tabs to each other, thereby preventing the rotation of the upper portion 130 and the lower portion 140, and providing a robust and secure device that is resistant to damage from dropping, etc.

In an embodiment, a locking mechanism for the voice activated device 100 may include an upper portion 130 having a first plurality of inward-facing tabs, and a lower portion 140 having a second plurality of inward-facing tabs. A set of screws may pass through the lower portion 140 and through the first plurality of inward-facing tabs and the second plurality of inward-facing tabs to secure the upper portion 130 to the lower portion 140.

The reflector component 286 may be disposed adjacent to the amplifier board 282. The reflector component 286 may be configured to reflect light and may be configured to direct, reflect, or guide light emitted from one or more LEDs disposed on the amplifier board 282. The reflector component 286 may be circular and may include a circular perimeter. The reflector component 286 is illustrated in detail in FIG. 8.

The amplifier board 282 may be a circuit board disposed adjacent to a lower surface of the lower portion 140. The amplifier board 282 may include one or more LEDs. The reflector component 286 may be disposed adjacent to the amplifier board 282, and the bottom cover 290 may be coupled to the lower portion 140. The bottom cover may include a translucent light ring. The light ring may be formed of an optically clear resin, such as a white colored resin. The light ring may form a portion of an outer surface of the voice activated device 100, and may be disposed between an upper portion of the bottom cover 290 and the lower portion 140 of the housing, such that light emitted from the LEDs is visible through the light ring.

Figure 3:
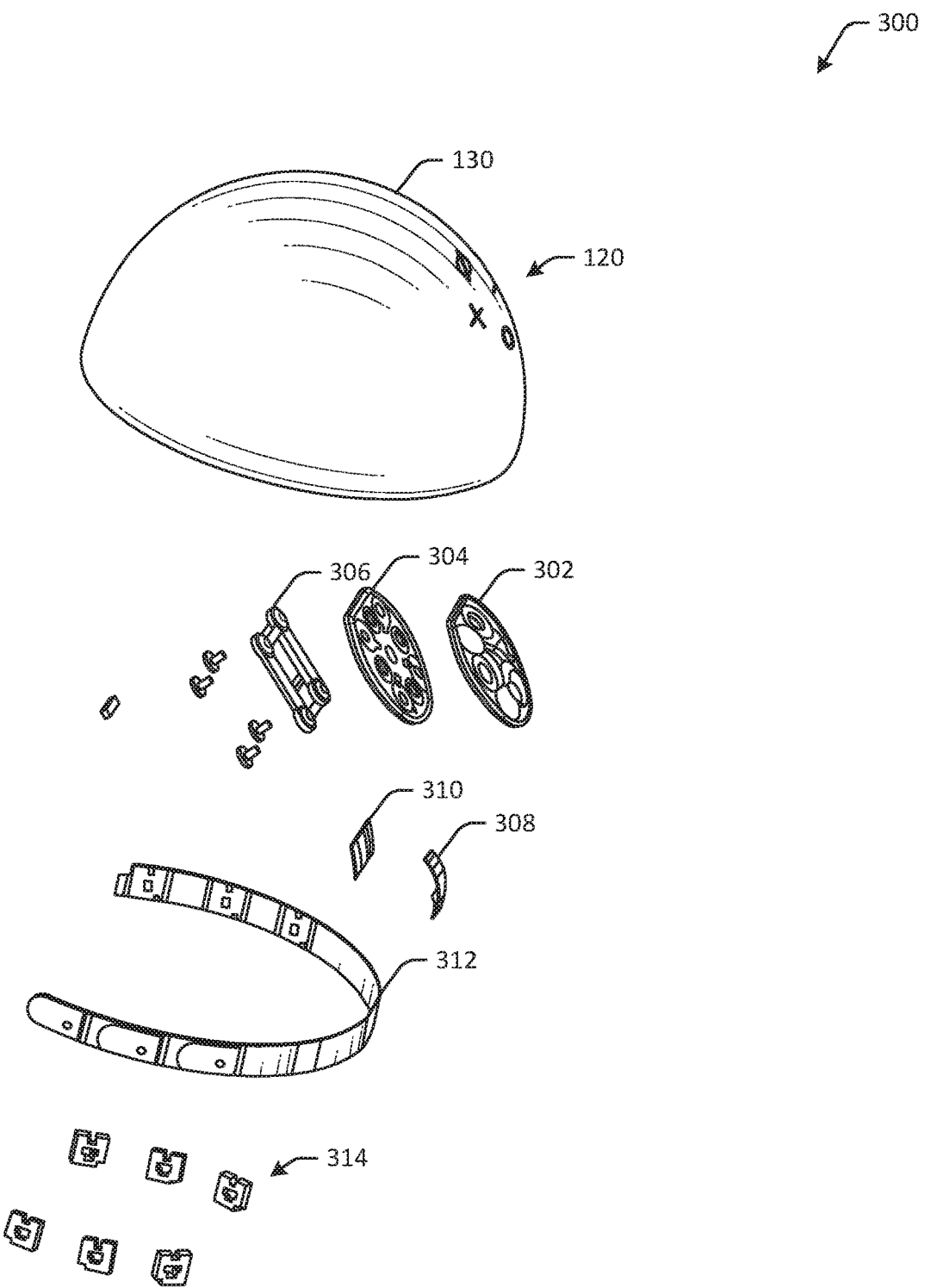
FIG. 3 is a schematic drawing of an upper portion assembly of a voice activated device in an exploded view in accordance with one or more embodiments of the disclosure.

FIG. 3 is a schematic drawing of an upper portion assembly 300 of a voice activated device in an exploded view in accordance with one or more embodiments of the disclosure. The voice activated device may be the same or different than the voice activated device of FIGS. 1-2. Other embodiments may include additional or fewer, and/or different, components.

In FIG. 3, a number of components may be coupled to the upper portion 130 of the housing of a voice activated device. For example, a set of buttons 302 may be coupled to a button printed circuit board assembly 304. A foam layer 306 may be disposed on a side of the button printed circuit board assembly 304 opposite the set of buttons 302. The set of buttons 302 may be accessible externally relative to the interior of the device. For example, a user may press or otherwise engage with one or more of the set of buttons 302 (e.g., the buttons 120 may be formed by the set of buttons 302, etc.). In other embodiments, the set of buttons 302 may be formed of a different material, such as plastic. The set of buttons 302 may include at least one button formed of a translucent material, such that light can propagate through the button. An ambient light sensor may be disposed on the button printed circuit board assembly 304 adjacent to the translucent button. The ambient light sensor may be configured to determine ambient light levels or measurements, which may be used to modify intensity of LEDs that illuminate a light ring at a bottom of the device. For example, the set of buttons may be accessible through the upper portion, and may include a first button operable to control a function of the voice activated device. The ambient light sensor may be positioned below the first button. The ambient light sensor may receive ambient light propagating through the first button. One or more LEDs may be disposed on the button printed circuit board assembly 304. For example, a red LED may be disposed adjacent to a mute or privacy button of the set of buttons 302, and may illuminate the button when a muted or privacy state is activated. The button assembly may be coupled to an inner surface of the upper portion 130 of the housing. Other embodiments may include different components and/or different configurations.

Accordingly, in an example embodiment, a button assembly may be coupled to the upper portion 130. The button assembly may include the set of buttons 302 accessible through the upper portion 130. The set of buttons 302 may include a clear or translucent button, and the button printed circuit board assembly 304. The button printed circuit board assembly 304 may include an ambient light sensor that is configured to detect ambient light propagating through the translucent button.

A microphone flexible printed circuit board assembly 312 may be coupled to the upper portion 130. The microphone flexible printed circuit board assembly 312 may include one or more microphones 314. For example, the microphone flexible printed circuit board assembly 312 may include two or more microphones 314, such as six microphones as illustrated in FIG. 3. The microphones 314 may be disposed between the microphone flexible printed circuit board assembly 312 and the upper portion 130. A foam layer 310 may be used to separate the microphones from the upper portion 130. The voice activated device may include a flexible jumper 308 that couples the microphone flexible printed circuit board assembly 312 to the button printed circuit board assembly 304. The flexible jumper 308 may be disposed at least partially between the upper housing 130 and the button printed circuit board assembly 304. In an embodiment, the microphone flexible printed circuit board assembly 312 may include a first set of microphones and a second set of microphones, and may be arranged such that the first set of microphones may be disposed on a first side of the voice activated device (e.g., a left side or a right side, etc.), and the second set of microphones may be disposed on a second side of the voice activated device.

Figure 4:
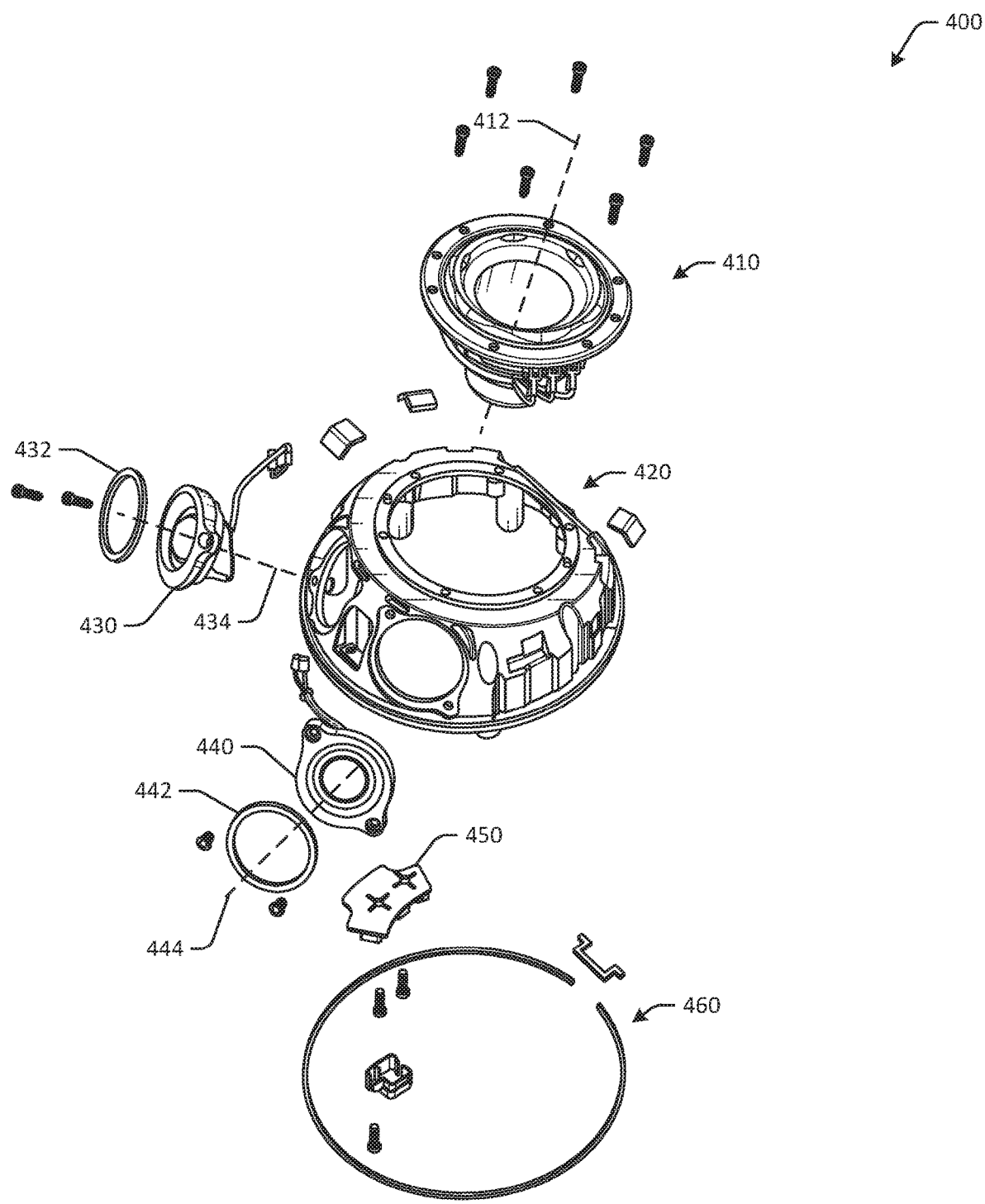
FIG. 4 is a schematic drawing of a speaker housing and additional components of a voice activated device in an exploded view in accordance with one or more embodiments of the disclosure.

FIG. 4 is a schematic drawing of a speaker housing and additional components of a voice activated device in an exploded view 400 in accordance with one or more embodiments of the disclosure. The voice activated device may be the same or different than the voice activated device of FIGS. 1-3. Other embodiments may include additional or fewer, and/or different, components.

In FIG. 4, a speaker housing 420 is depicted. The speaker housing 420 may be the same as the speaker housing 230 of FIG. 2. A subwoofer 410 may be secured to an upper surface of the speaker housing 420. The subwoofer may provide bass response, and sound output from the subwoofer may be directed upwards when the device is positioned on a flat surface. The subwoofer may have a third central axis 412. A number of speakers may be coupled to a side surface of the speaker housing 420. For example, a first speaker 430 may be coupled to the side surface of the speaker housing 420. The first speaker 430 may have a first central axis 434. A foam layer 432 may be disposed about a perimeter of the first speaker 430 and/or may be disposed between the first speaker 430 and an upper portion of the housing. A second speaker 440 may be coupled to the side surface of the speaker housing 420. The second speaker 440 may have a second central axis 444. A foam layer 442 may be disposed about a perimeter of the second speaker 440 and/or may be disposed between the second speaker 440 and the upper portion of the housing. The first speaker 430 and the second speaker 440 may be tweeters. The first speaker 430 and the second speaker 440 may be oriented toward a front of the device and may be separated at an angle of about 50 degrees. Any number of speakers may be included at any number of different orientations.

A speaker printed circuit board 450 may be coupled to the speaker housing 420 and may be configured to provide audio signal to one or more of the subwoofer 410, the first speaker 430, and/or the second speaker 440. A foam layer 460 may be disposed about a lower surface of the speaker housing 420 and may provide an airtight seal between the speaker housing 420 and the lower portion of the housing.

Figure 5:
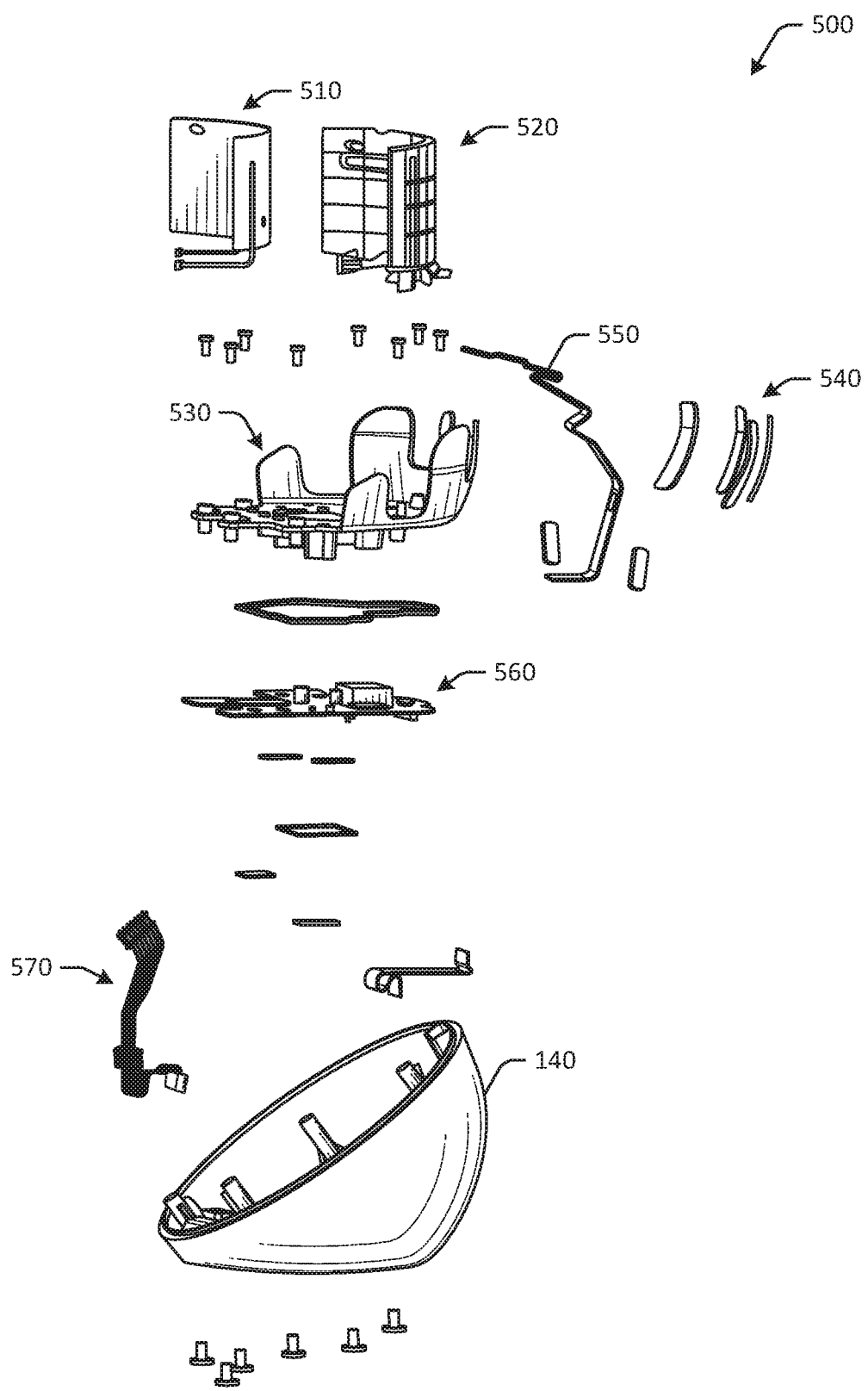
FIG. 5 is a schematic drawing of a lower portion assembly of a voice activated device in an exploded view in accordance with one or more embodiments of the disclosure.

FIG. 5 is a schematic drawing of a lower portion assembly of a voice activated device in an exploded view 500 in accordance with one or more embodiments of the disclosure. The voice activated device may be the same or different than the voice activated device of FIGS. 1-4. Other embodiments may include additional or fewer, and/or different, components.

In FIG. 5, a number of components may be coupled to a lower portion 140 of the housing of a voice activated device. For example, an antenna assembly 510 may be coupled to an antenna bracket 520. The antenna assembly 510 may be flexible. The antenna bracket 520 may have a non-planar contour. The antenna assembly 510 and the antenna bracket 520 may be coupled to a heatsink 530, which may be coupled to the lower portion 140. One or more antennas may be disposed on the antenna assembly 510, such as a LoRa antenna, a Bluetooth antenna, a ZigBee antenna, and/or other or different antennas.

The heatsink 530 may include a number of wings that extract heat from a main logic board 560 and/or other electronics in the device and move thermal energy to an outer surface of the device for dissipation. The heatsink 530 may have a curved contour that corresponds to a curvature of the lower portion 140. The heatsink 530 may be disposed within the sealed chamber formed by the speaker housing illustrated in FIG. 4 and the lower portion 140 of the housing depicted in FIG. 5. A number of foam layers 540 may separate the heatsink 530 from the lower portion 140 when assembled.

A flexible connecter 550 may electrically couple the main logic board 560 to the button printed circuit board assembly. The main logic board 560 may be disposed at a lower surface of the heatsink 530. The main logic board 560 may be coupled to an upper side of the lower portion 140. An amplifier board may be coupled to a lower side of the lower portion 140. Speaker cables 570 may be coupled to the amplifier board and one or more of the speakers coupled to the speaker housing.

Figure 6:
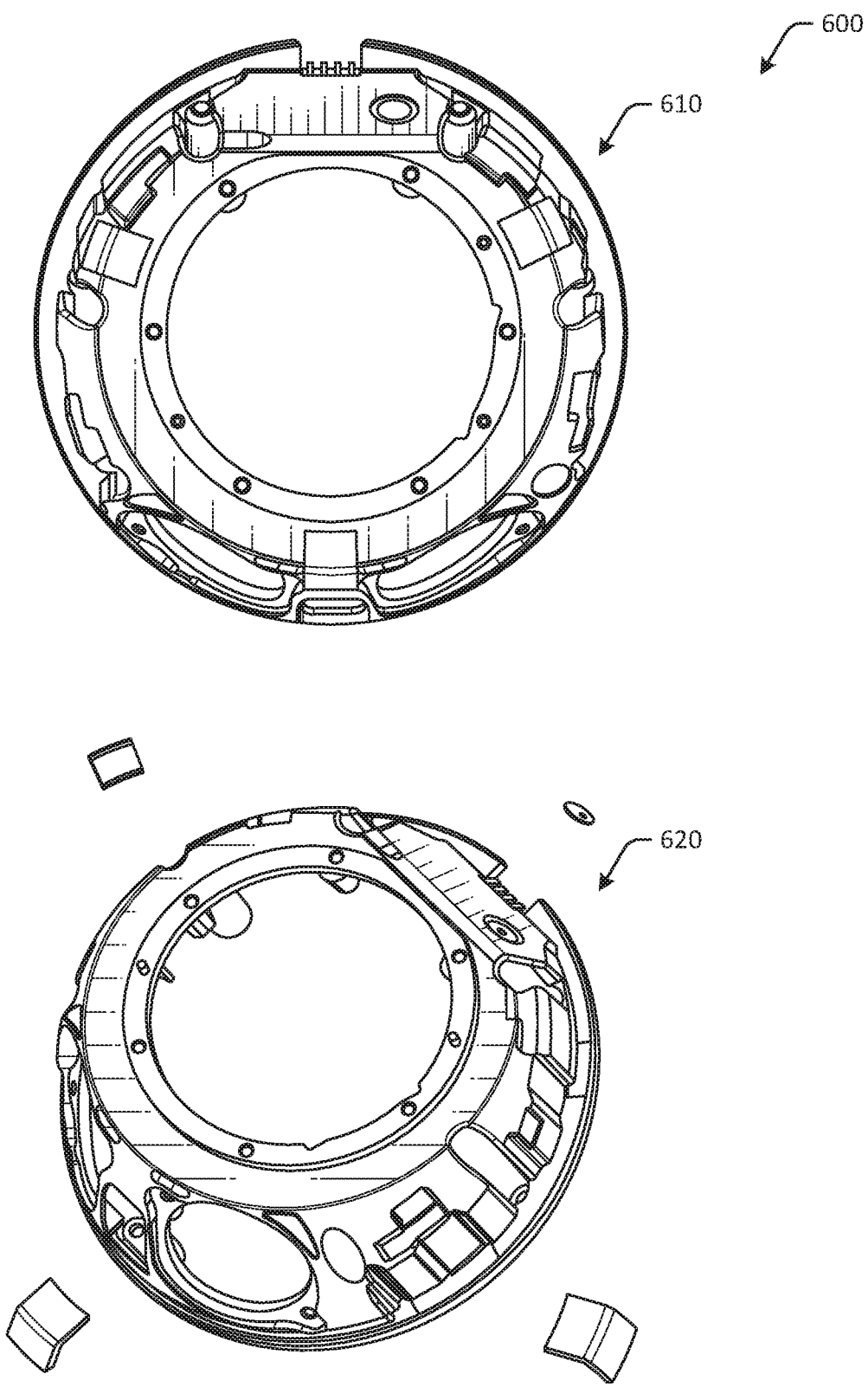
FIG. 6 is a schematic drawing of a speaker housing of a voice activated device in various views in accordance with one or more embodiments of the disclosure.

FIG. 6 is a schematic drawing of a speaker housing 600 of a voice activated device in various views in accordance with one or more embodiments of the disclosure. The speaker housing may be the same or different than the speaker housing of FIGS. 1-4. Other embodiments may include additional or fewer, and/or different, components.

In FIG. 6, the speaker housing 600 is illustrated in a top view 610 and a perspective view 620. The speaker housing 600 may be formed of plastic, metal, or a different material. The speaker housing 600 may increase the rigidity of the device and may be coupled to the lower portion of the housing to form a sealed chamber or volume of air that can be used by the speakers and/or subwoofers to output sound. A number of pieces of foam and/or damping paper may be included to improve sound performance and reduce potential rattling or other motion being imparted to the upper portion or the lower portion of the housing. The foam may assist with reducing of buzzing and/or rubbing between components of the voice activated device. The damping paper may assist with pressure equalization and may be a breathable membrane.

In one embodiment, the speaker housing 600 may be coupled to the bottom portion or the lower portion of the housing. The speaker housing 600 and the lower portion may together form a sealed chamber. A subwoofer may be coupled to the speaker housing 600 and may be disposed at an upwards and non-vertical angle. A set of one or more tweeters may be coupled to a side surface of the speaker housing 600 and arranged at an angle transverse to the subwoofer. For example, if the subwoofer is arranged to output sound upwards, the tweeter(s) may be arranged to output sound in a lateral direction relative to the device sidewall.

Figure 7:
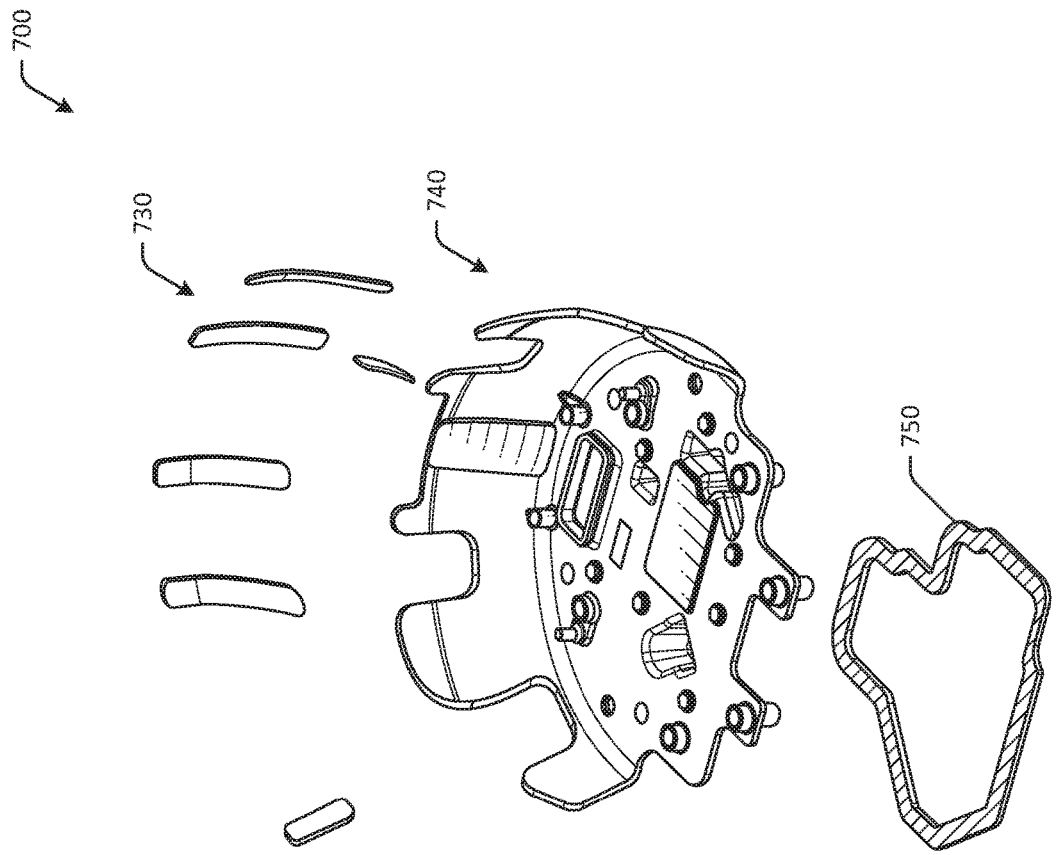
FIG. 7 is a schematic drawing of a heatsink and additional components of a voice activated device in various views in accordance with one or more embodiments of the disclosure.
Figure 7:
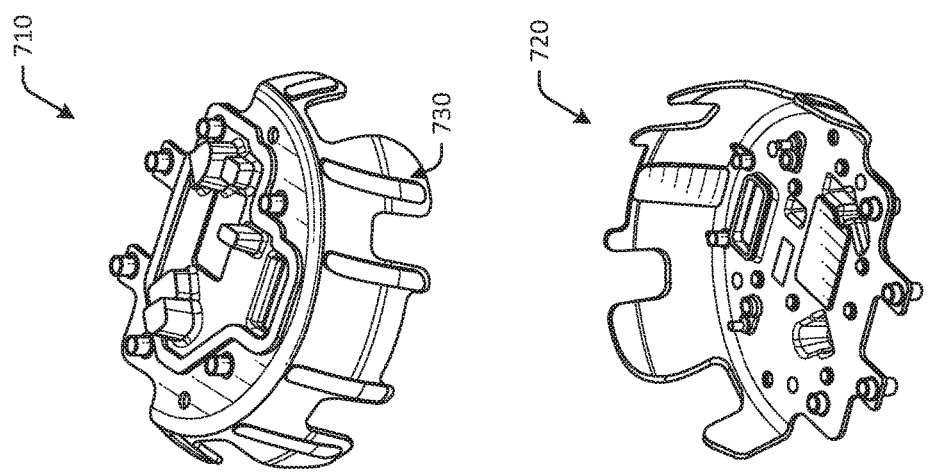

FIG. 7 is a schematic drawing of a heatsink and additional components 700 of a voice activated device in various views in accordance with one or more embodiments of the disclosure. The heatsink may be the same or different than the heatsink of FIGS. 1-4. Other embodiments may include additional or fewer, and/or different, components.

As illustrated in a bottom perspective view 710, the heatsink 700 may have a bottom surface that is coupled to an upper surface of the lower portion of the housing of the voice activated device. In a top perspective view 720, an opening may be formed in the bottom surface of the heatsink 700 to allow passage of one or more cables and/or flexible jumpers. In an exploded view 740, a foam layer 750 may be disposed on the bottom surface of the heatsink 700 and may provide audio sealing, and one or more foam tabs 730 may be coupled to an outer side surface of the heatsink 700 and may prevent or reduce buzzing sounds. The heatsink 700 may include a number of wings that draws heat up and away from the main logic board or other electronics in the device. The heatsink 700 may form part of a skeleton of the device to provide improved rigidity and/or mechanical strength.

Figure 8:
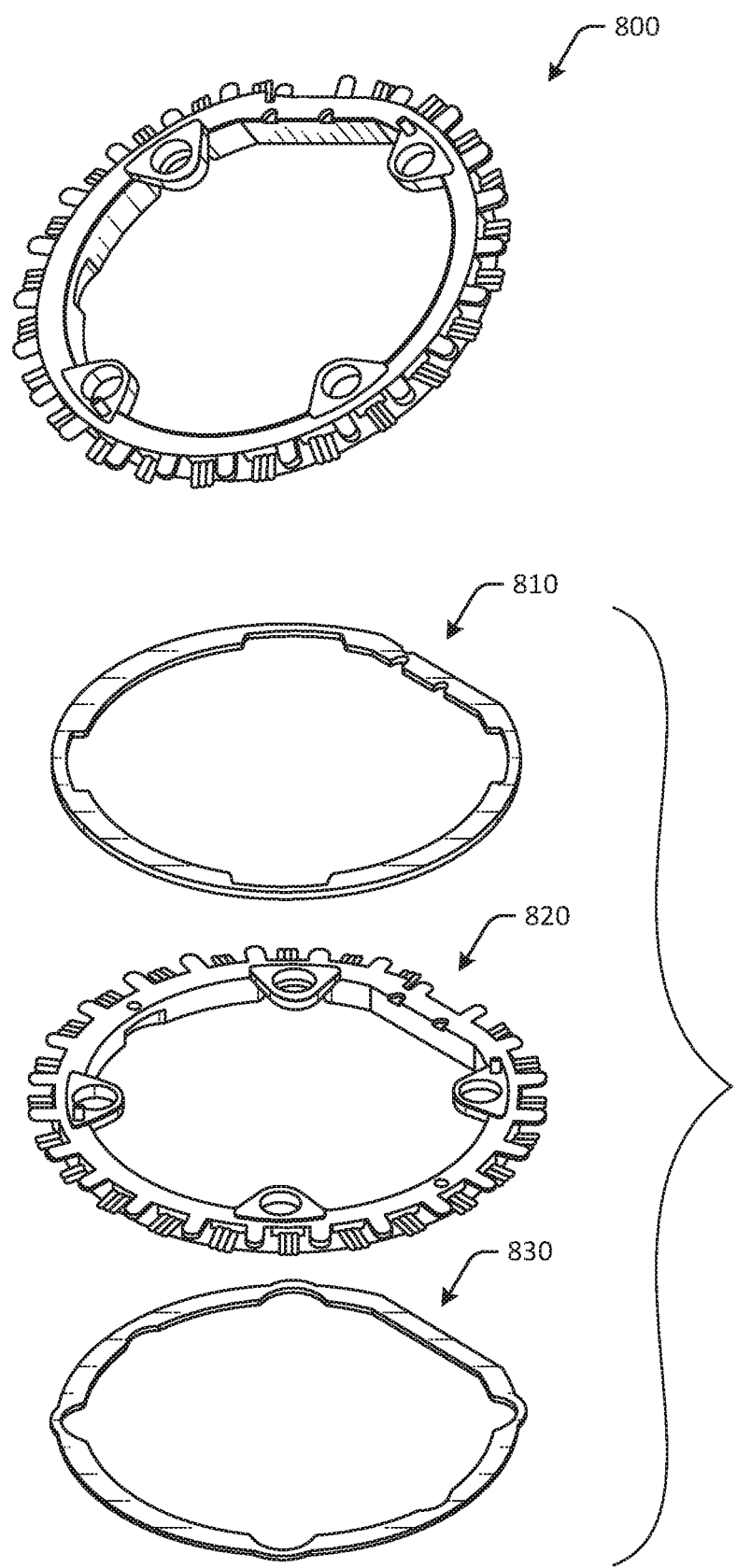
FIG. 8 is a schematic drawing of a reflector assembly of a voice activated device in an exploded view in accordance with one or more embodiments of the disclosure.

FIG. 8 is a schematic drawing of a reflector assembly 800 of a voice activated device in an exploded view in accordance with one or more embodiments of the disclosure. The reflector assembly may be the same or different than the reflector assembly described in FIGS. 1-4. Other embodiments may include additional or fewer, and/or different, components.

The reflector assembly 800 may include a circular reflector component 820, a first foam layer 810 disposed on a first side of the circular reflector component 820, and a second foam layer 830 disposed on a second side of the circular reflector component 820. The circular reflector component 820 may be disposed adjacent to an inner portion of the light ring of the bottom cover. The circular reflector component 820 may include a set of tabs disposed about a perimeter of the circular reflector component 820, as illustrated in FIG. 8. The set of tabs may assist in drawing light emitted from LEDs on the amplifier board toward a light ring component of the bottom cover, as discussed with respect to FIG. 9.

The circular reflector component 820 may be configured to reflect light from one or more LEDs, and may be disposed adjacent to an inner portion of the light ring. Any number of tabs or outward facing members may be included.

Figure 9:
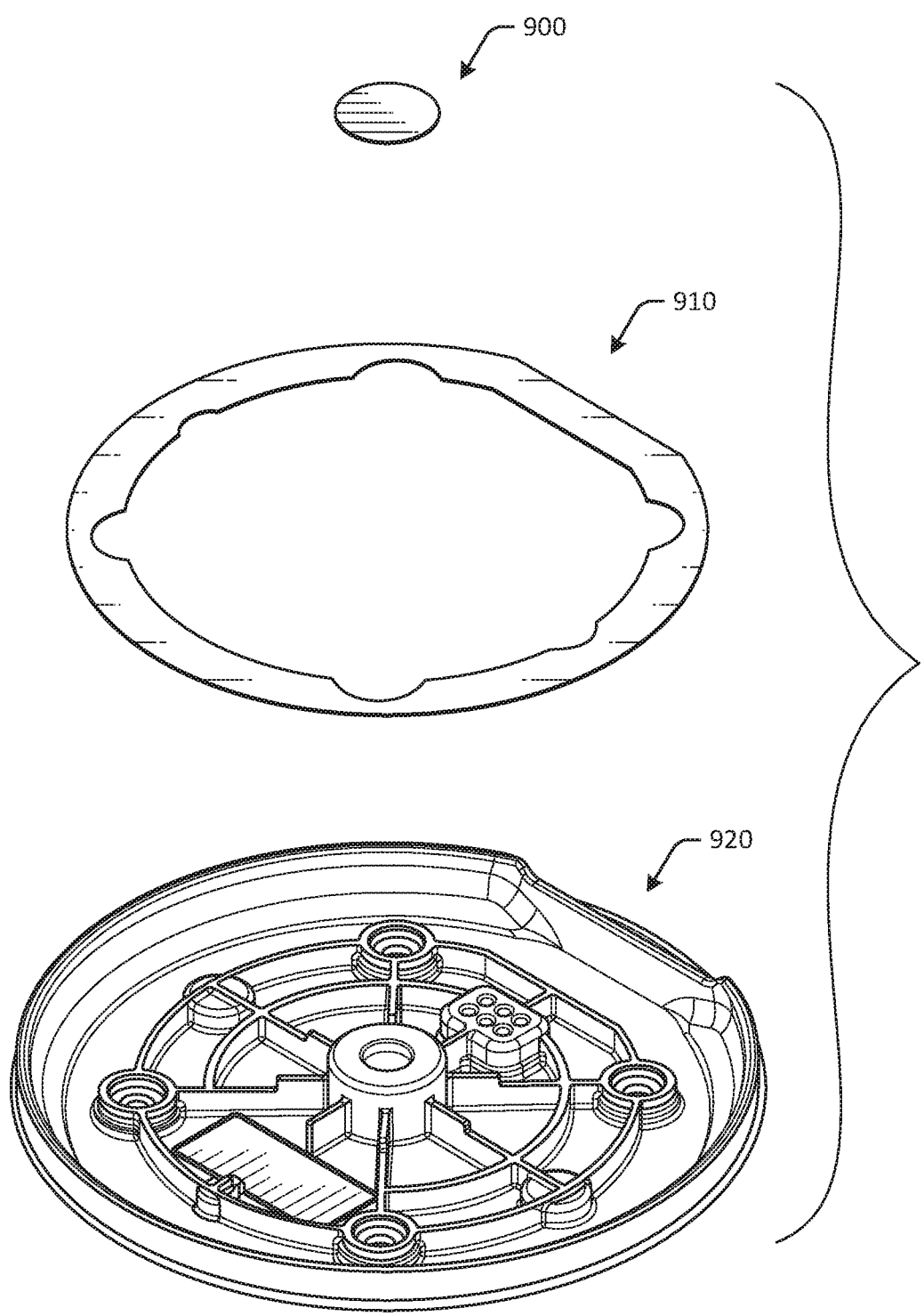
FIG. 9 is a schematic drawing of a bottom cover assembly of a voice activated device in an exploded view in accordance with one or more embodiments of the disclosure.

FIG. 9 is a schematic drawing of a bottom cover assembly of a voice activated device in an exploded view in accordance with one or more embodiments of the disclosure. The bottom cover assembly may be the same or different than the bottom cover assembly described in FIGS. 1-4. Other embodiments may include additional or fewer, and/or different, components.

The bottom cover assembly may include a bottom cover 920, a reflector assembly 910, which may be the reflector assembly of FIG. 8, and a tape component 900, such as double-sided tape, that may reduce static generation. A light ring may be coupled to the bottom cover 920. For example, a translucent plastic light ring may be disposed about a perimeter of the bottom cover 920, such that the light ring is disposed between the bottom cover 920 and the lower portion 140 of a voice activated device. The bottom cover assembly may therefore provide a flat bottom surface for the voice activated device. The reflector assembly 910 may include a reflective sheet to reflect light and may be, in one example, a bright white color.

In an embodiment, the voice activated device may include a microphone, a speaker, a housing having a top portion and a bottom portion, a light ring component disposed along an outer surface of the bottom portion of the device, and a plurality of LEDs positioned adjacent to the light ring component. The device may have a substantially spherical geometry.

The light ring of the voice activated device may be configured to indicate a location of sound detected by the voice activated device. For example, if a microphone of the voice activated device detects sound or voice coming from a left side of the voice activated device, one or more LEDs on the left side of the voice activated device may be caused to illuminate, so as to indicate to a user that sound is being detected from the left side of the voice activated device. The light ring may dynamically modify LEDs that are illuminated while sound or voice is detected, and may also be used to visually communicate information to a user. For example, during processing, the light ring may have a certain illumination status, while the device is muted, the light ring may have a different illumination status, and so forth.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Device Architecture

Figure 10:
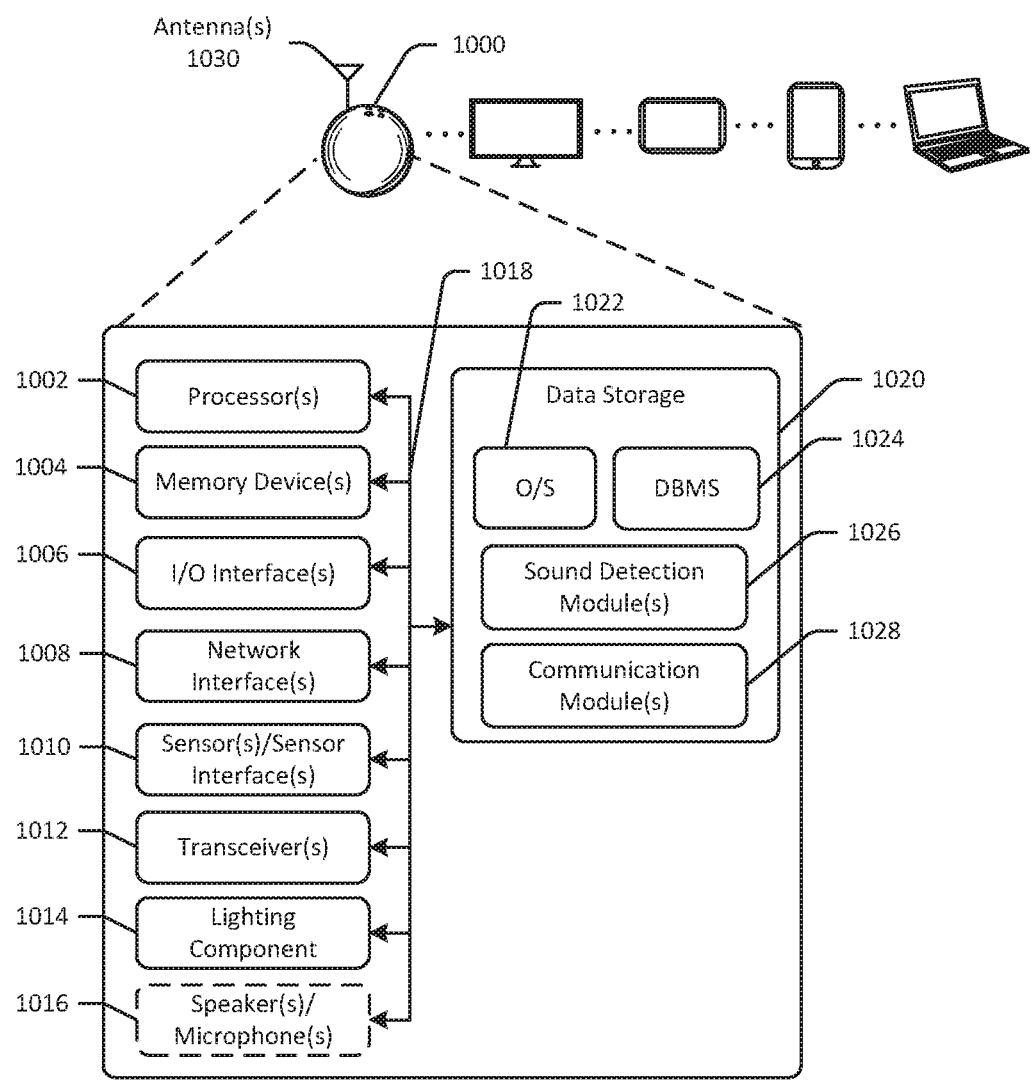
FIG. 10 schematically illustrates an example architecture of a voice activated device with integrated heatsink and speaker in accordance with one or more embodiments of the disclosure.

FIG. 10 is a schematic block diagram of one or more illustrative voice activated device(s) 1000 in accordance with one or more example embodiments of the disclosure. The voice activated device(s) 1000 may include any suitable computing device with a light bar component with or without a display, in some instances, including, but not limited to, a server system, a mobile device such as a smartphone, a tablet, an e-reader, a wearable device, or the like; a desktop computer; a laptop computer; a content streaming device; a set-top box; a scanning device; a speaker device; or the like. The voice activated device(s) 1000 may correspond to an illustrative device configuration for the voice activated device of FIGS. 1-9.

The voice activated device(s) 1000 may be configured to communicate with one or more servers, user devices, or the like. The voice activated device(s) 1000 may be configured to determine voice commands, determine wakeword utterances, determine and/or control other devices, and other operations. The voice activated device(s) 1000 may be configured to emit light, detect sound, output digital content, and other functionality. In some embodiments, a single remote server or a single group of remote servers may be configured to perform more than one type of functionality in conjunction with a voice activated device.

The voice activated device(s) 1000 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the voice activated device(s) 1000 may include one or more processors (processor(s)) 1002, one or more memory devices 1004 (also referred to herein as memory 1004), one or more input/output (I/O) interface(s) 1006, one or more network interface(s) 1008, one or more sensor(s) or sensor interface(s) 1010, one or more transceiver(s) 1012, one or more lighting components 1014, and one or more optional camera(s)/microphone(s) 1016, and data storage 1020. The voice activated device(s) 1000 may further include one or more bus(es) 1018 that functionally couple various components of the voice activated device(s) 1000. The voice activated device(s) 1000 may further include one or more antenna(s) 1030 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 1018 may include at least one of a system bus, a memory bus, an address bus, or a message bus, and may permit the exchange of information (e.g., data (including computer-executable code), signaling, etc.) between various components of the voice activated device(s) 1000. The bus(es) 1018 may include, without limitation, a memory bus or a memory controller, a peripheral bus, an accelerated graphics port, and so forth. The bus(es) 1018 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 1004 of the voice activated device(s) 1000 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 1004 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 1004 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 1020 may include removable storage and/or non-removable storage including, but not limited to, magnetic storage, optical disk storage, and/or tape storage. The data storage 1020 may provide non-volatile storage of computer-executable instructions and other data. The memory 1004 and the data storage 1020, removable and/or non-removable, are examples of computer-readable storage media (CRSM) as that term is used herein.

The data storage 1020 may store computer-executable code, instructions, or the like that may be loadable into the memory 1004 and executable by the processor(s) 1002 to cause the processor(s) 1002 to perform or initiate various operations. The data storage 1020 may additionally store data that may be copied to the memory 1004 for use by the processor(s) 1002 during the execution of the computer-executable instructions. Moreover, output data generated as a result of execution of the computer-executable instructions by the processor(s) 1002 may be stored initially in the memory 1004, and may ultimately be copied to the data storage 1020 for non-volatile storage.

More specifically, the data storage 1020 may store one or more operating systems (O/S) 1022; one or more database management systems (DBMS) 1024; and one or more program module(s), applications, engines, computer-executable code, scripts, or the like such as, for example, one or more sound detection module(s) 1026 and/or one or more communication module(s) 1028. Some or all of these module(s) may be sub-module(s). Any of the components depicted as being stored in the data storage 1020 may include any combination of software, firmware, and/or hardware. The software and/or firmware may include computer-executable code, instructions, or the like that may be loaded into the memory 1004 for execution by one or more of the processor(s) 1002. Any of the components depicted as being stored in the data storage 1020 may support functionality described in reference to corresponding components named earlier in this disclosure.

The data storage 1020 may further store various types of data utilized by the components of the voice activated device(s) 1000. Any data stored in the data storage 1020 may be loaded into the memory 1004 for use by the processor(s)

1002 in executing computer-executable code. In addition, any data depicted as being stored in the data storage 1020 may potentially be stored in one or more datastore(s) and may be accessed via the DBMS 1024 and loaded in the memory 1004 for use by the processor(s) 1002 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like. In FIG. 10, an example datastore(s) may include, for example, historical data for previously identified utterances, speaker identification or profile information, and/or other information.

The processor(s) 1002 may be configured to access the memory 1004 and execute the computer-executable instructions loaded therein. For example, the processor(s) 1002 may be configured to execute the computer-executable instructions of the various program module(s), applications, engines, or the like of the voice activated device(s) 1000 to cause or facilitate various operations to be performed in accordance with one or more embodiments of the disclosure. The processor(s) 1002 may include any suitable processing unit capable of accepting data as input, processing the input data in accordance with stored computer-executable instructions, and generating output data. The processor(s) 1002 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 1002 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 1002 may be capable of supporting any of a variety of instruction sets.

Referring now to functionality supported by the various program module(s) depicted in FIG. 10, the sound detection module(s) 1026 may include computer-executable instructions, code, or the like that responsive to execution by one or more of the processor(s) 1002 may perform functions including, but not limited to, detect sound, determine sound meanings, generate audio signals and audio data, determine a location of sound, determining a light bar illumination status, determining which LEDs to illuminate, causing a change in illumination status, and the like.

The communication module(s) 1028 may include computer-executable instructions, code, or the like that responsive to execution by one or more of the processor(s) 1002 may perform functions including, but not limited to, sending and/or receiving data, including content, sending and/or receiving instructions and commands, and the like.

Referring now to other illustrative components depicted as being stored in the data storage 1020, the O/S 1022 may be loaded from the data storage 1020 into the memory 1004 and may provide an interface between other application software executing on the voice activated device(s) 1000 and the hardware resources of the voice activated device(s) 1000. More specifically, the O/S 1022 may include a set of computer-executable instructions for managing the hardware resources of the voice activated device(s) 1000 and for providing common services to other application programs (e.g., managing memory allocation among various application programs). In certain example embodiments, the O/S 1022 may control execution of the other program module(s). The O/S 1022 may include any operating system now known or which may be developed in the future including, but not limited to, any server operating system, any mainframe operating system, or any other proprietary or non-proprietary operating system.

The DBMS 1024 may be loaded into the memory 1004 and may support functionality for accessing, retrieving, storing, and/or manipulating data stored in the memory 1004 and/or data stored in the data storage 1020. The DBMS 1024 may use any of a variety of database models (e.g., relational model, object model, etc.) and may support any of a variety of query languages. The DBMS 1024 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the voice activated device(s) 1000 is a mobile device, the DBMS 1024 may be any suitable lightweight DBMS optimized for performance on a mobile device.

Referring now to other illustrative components of the voice activated device(s) 1000, the input/output (I/O) interface(s) 1006 may facilitate the receipt of input information by the voice activated device(s) 1000 from one or more I/O devices as well as the output of information from the voice activated device(s) 1000 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the voice activated device(s) 1000 or may be separate. The I/O devices may further include, for example, any number of peripheral devices such as data storage devices, printing devices, and so forth.

The I/O interface(s) 1006 may also include an interface for an external peripheral device connection such as universal serial bus (USB), FireWire, Thunderbolt, Ethernet port or other connection protocol that may connect to one or more networks. The I/O interface(s) 1006 may also include a connection to one or more of the antenna(s) 1030 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, a LoRa (long range) network, etc.

The voice activated device(s) 1000 may further include one or more network interface(s) 1008 via which the voice activated device(s) 1000 may communicate with any of a variety of other systems, platforms, networks, devices, and so forth. The network interface(s) 1008 may enable communication, for example, with one or more wireless routers, one or more host servers, one or more web servers, and the like via one or more networks.

The antenna(s) 1030 may include any suitable type of antenna depending, for example, on the communications protocols used to transmit or receive signals via the antenna(s) 1030. Non-limiting examples of suitable antennas may include directional antennas, non-directional antennas, dipole antennas, folded dipole antennas, patch antennas, multiple-input multiple-output (MIMO) antennas, or the like. The antenna(s) 1030 may be communicatively coupled to one or more transceivers 1012 or radio components to which or from which signals may be transmitted or received.

As previously described, the antenna(s) 1030 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(s) 1030 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(s) 1030 may be configured to transmit or receive radio frequency signals within any suitable frequency range forming part of the unlicensed portion of the radio spectrum.

The antenna(s) 1030 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 1012 may include any suitable radio component(s) for—in cooperation with the antenna(s) 1030—transmitting or receiving radio frequency (RF) signals in the bandwidth and/or channels corresponding to the communications protocols utilized by the voice activated device(s) 1000 to communicate with other devices. The transceiver(s) 1012 may include hardware, software, and/or firmware for modulating, transmitting, or receiving—potentially in cooperation with any of antenna(s) 1030—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 1012 may further include hardware, firmware, or software for receiving GNSS signals. The transceiver(s) 1012 may include any known receiver and baseband suitable for communicating via the communications protocols utilized by the voice activated device(s) 1000. The transceiver(s) 1012 may further include a low noise amplifier (LNA), additional signal amplifiers, an analog-to-digital (A/D) converter, one or more buffers, a digital baseband, or the like.

The sensor(s)/sensor interface(s) 1010 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The linear lighting element(s) 1014 may include one or more LEDs that may be illuminated responsive to detected sound and may be in a linear configuration. The optional camera(s) 1016 may be any device configured to capture ambient light or images. The optional microphone(s) 1016 may be any device configured to receive analog sound input or voice data.

It should be appreciated that the program module(s), applications, computer-executable instructions, code, or the like depicted in FIG. 10 as being stored in the data storage 1020 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the voice activated device(s) 1000, and/or hosted on other computing device(s) accessible via one or more networks, may be provided to support functionality provided by the program module(s), applications, or computer-executable code depicted in FIG. 10 and/or additional or alternate functionality. Further, functionality may be modularized differently such that processing described as being supported collectively by the collection of program module(s) depicted in FIG. 10 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 10 may be implemented, at least partially, in hardware and/or firmware across any number of devices.

It should further be appreciated that the voice activated device(s) 1000 may include alternate and/or additional hardware, software, or firmware components beyond those described or depicted without departing from the scope of the disclosure. More particularly, it should be appreciated that software, firmware, or hardware components depicted as forming part of the voice activated device(s) 1000 are merely illustrative and that some components may not be present or additional components may be provided in various embodiments. While various illustrative program module(s) have been depicted and described as software module(s) stored in the data storage 1020, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and use cases of FIGS. 1-9 may be performed by a device having the illustrative configuration depicted in FIG. 10, or more specifically, by one or more engines, program module(s), applications, or the like executable on such a device. It should be appreciated, however, that such operations may be implemented in connection with numerous other device configurations.

The operations described and depicted in the illustrative methods and process flows of FIGS. 1-9 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-9 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A voice activated device comprising:
   a spherical housing comprising a top portion and a bottom portion;
   an integrated speaker and heatsink assembly comprising:
     a speaker housing coupled to a first side of the bottom portion, wherein the speaker housing and the bottom portion together define a sealed chamber;
     a heatsink coupled to the bottom portion and disposed within the sealed chamber, the heatsink comprising a non-planar contour;
     a subwoofer coupled to the speaker housing and configured to output sound at a first angle upwards towards the top portion; and
     a tweeter coupled to the speaker housing and configured to output sound at a second angle transverse to the first angle;
   a set of light emitting diodes (LEDs) configured to emit light, the set of LEDs positioned within the spherical housing; and
   a bottom cover coupled to a second side of the bottom portion, the bottom cover comprising a circular light ring disposed about a perimeter of the bottom cover, such that light emitted from the set of LEDs is visible through the circular light ring.

2. The voice activated device of claim 1, further comprising:
   a curved antenna bracket disposed adjacent to the speaker housing; and
   a flexible antenna assembly coupled to the curved antenna bracket, the flexible antenna assembly comprising a Wide Area Network (WAN) antenna, a Bluetooth antenna, and a ZigBee antenna.

3. The voice activated device of claim 1, further comprising:
   a button assembly coupled to the top portion, the button assembly comprising:
     a set of buttons accessible through the top portion, the set of buttons comprising a translucent button operable to control a function of the voice activated device; and
     an ambient light sensor positioned below the translucent button;
     wherein the ambient light sensor receives ambient light propagating through the translucent button.

4. The voice activated device of claim 1, further comprising:
   a flexible printed circuit board assembly coupled to the top portion, the flexible printed circuit board assembly comprising a first set of microphones and a second set of microphones; and
   a flexible jumper coupled to the flexible printed circuit board assembly and disposed at least partially in the sealed chamber;
   wherein the flexible printed circuit assembly is arranged such that the first set of microphones is disposed on a first side of the voice activated device, and the second set of microphones is disposed on a second side of the voice activated device.

5. A voice activated device comprising:
   a housing having an upper portion and a lower portion;
   a speaker housing coupled to the lower portion, wherein the speaker housing and the lower portion together form a sealed chamber;
   a heatsink coupled to the lower portion and disposed in the sealed chamber;
   a first speaker coupled to an upper surface of the speaker housing and partially disposed within the sealed chamber, wherein the first speaker is oriented to output audio towards the upper portion of the housing;
   a second speaker coupled to a side surface of the speaker housing; and
   a third speaker coupled to the side surface of the speaker housing.

6. The voice activated device of claim 5, wherein the first speaker is a subwoofer.

7. The voice activated device of claim 5, wherein the second speaker is oriented along a first axis, and the third speaker is oriented along a second axis; and
   wherein an angular distance between the first axis and the second axis is between about 40 degrees and about 100 degrees.

8. The voice activated device of claim 5, further comprising:
   a curved antenna bracket disposed adjacent to the speaker housing; and
   a flexible antenna assembly coupled to the curved antenna bracket, the flexible antenna assembly comprising a Wide Area Network (WAN) antenna, a Bluetooth antenna, and a ZigBee antenna.

9. The voice activated device of claim 5, further comprising:

a circuit board disposed adjacent to a lower surface of the lower portion, the circuit board comprising a plurality of light emitting diodes (LEDs);

a circular light reflector component disposed adjacent to the circuit board; and a bottom cover coupled to the lower portion, wherein the bottom cover comprises a light ring.

10. The voice activated device of claim 9, wherein the light ring forms a portion of an outer surface of the voice activated device, and wherein the light ring is disposed between an upper portion of the bottom cover and the lower portion of the housing, such that light emitted from the LEDs is visible through the light ring.

11. The voice activated device of claim 5, wherein the lower portion comprises a curved side surface, and wherein the heatsink comprises a curved contour.

12. The voice activated device of claim 5, further comprising:

a button assembly coupled to the upper portion, the button assembly comprising:

a set of buttons accessible through the upper portion, the set of buttons comprising a first button operable to control a function of the voice activated device; and an ambient light sensor positioned adjacent to the first button;

wherein the ambient light sensor receives ambient light propagating through the first button.

13. The voice activated device of claim 5, further comprising:

a flexible printed circuit board assembly coupled to the upper portion, the flexible printed circuit board assembly comprising a plurality of microphones; and a flexible jumper coupled to the flexible printed circuit board assembly and disposed at least partially in the sealed chamber.

14. The voice activated device of claim 5, further comprising:

a flat bottom surface;

wherein the upper portion is coupled to the lower portion along a joint transverse to the flat bottom surface.

15. The voice activated device of claim 5, further comprising:

a fabric cover disposed at least partially over the upper portion;

wherein the upper portion has a hemispherical geometry.

16. A device comprising:

a microphone;

a speaker;

a housing having a top portion and a bottom portion;

a speaker housing coupled to the bottom portion, wherein the speaker housing and the bottom portion together form a sealed chamber;

a subwoofer coupled to the speaker housing and disposed at an upwards and non-vertical angle;

a light ring component disposed along an outer surface of the bottom portion of the device; and a plurality of LEDs positioned adjacent to the light ring component.

17. The device of claim 16, wherein the top portion comprises a first plurality of inward-facing tabs, and the bottom portion comprises a second plurality of inward-facing tabs, the device further comprising:

a set of screws configured to pass through the bottom portion and through the first plurality of inward-facing tabs and the second plurality of inward-facing tabs to secure the top portion to the bottom portion.

18. The device of claim 16, further comprising:

a set of tweeters coupled to a side surface of the speaker housing and arranged at an angle transverse to the subwoofer.

19. The device of claim 16, further comprising:

a reflector disposed adjacent to an inner portion of the light ring, the reflector comprising a set of tabs disposed about a perimeter of the reflector.

20. The device of claim 16, further comprising:

a button assembly coupled to the top portion, the button assembly comprising:

a set of buttons accessible through the top portion, the set of buttons comprising:

a first button operable to control a function of the voice activated device; and an ambient light sensor positioned adjacent to the first button;

wherein the ambient light sensor receives ambient light propagating through the first button.

* * * * *